(12) United States Patent
Spyrou et al.

(10) Patent No.: US 8,594,988 B1
(45) Date of Patent: *Nov. 26, 2013

(54) METHOD AND APPARATUS FOR CIRCUIT SIMULATION USING PARALLEL COMPUTING

(75) Inventors: Athanasius W. Spyrou, Sunnyvale, CA (US); Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 467 days.

This patent is subject to a terminal disclaimer.

(21) Appl. No.: 11/766,775

(22) Filed: Jun. 21, 2007

Related U.S. Application Data

(63) Continuation-in-part of application No. 11/760,694, filed on Jun. 8, 2007.

(60) Provisional application No. 60/831,717, filed on Jul. 18, 2006, provisional application No. 60/831,795, filed on Jul. 19, 2006.

(51) Int. Cl.
*G06F 17/50* (2006.01)
*G06F 7/60* (2006.01)
*G06F 17/10* (2006.01)
*G06F 9/455* (2006.01)

(52) U.S. Cl.
USPC ............... 703/14; 703/2; 703/19; 716/108; 716/113; 716/134

(58) Field of Classification Search
USPC ............... 703/14, 2, 19; 716/108, 113, 134
See application file for complete search history.

(56) References Cited

U.S. PATENT DOCUMENTS

| | | | |
|---|---|---|---|
| 5,392,227 A | 2/1995 | Hiserote | |
| 5,572,710 A * | 11/1996 | Asano et al. | 703/15 |
| 5,715,184 A * | 2/1998 | Tyler et al. | 703/15 |
| 6,928,635 B2 * | 8/2005 | Pramanik et al. | 716/21 |
| 7,076,416 B2 | 7/2006 | Chen et al. | |
| 7,454,722 B2 * | 11/2008 | Gupta et al. | 716/106 |
| 7,555,733 B1 * | 6/2009 | Gee et al. | 716/106 |
| 7,827,016 B1 * | 11/2010 | Ho | 703/13 |
| 2005/0091025 A1 * | 4/2005 | Wilson et al. | 703/16 |
| 2005/0268271 A1 * | 12/2005 | Gutberlet et al. | 716/18 |
| 2005/0273298 A1 * | 12/2005 | Shah | 703/2 |
| 2006/0085782 A1 * | 4/2006 | Ward | 716/18 |
| 2006/0123300 A1 * | 6/2006 | Gupta et al. | 714/741 |

(Continued)

OTHER PUBLICATIONS

Peter M. Lee, Shinji Ito, Takeaki Hashimoto, Junji Sato, Tomomasa Touma, and Goichi Yokomizo, "A Parallel and Accelerated Circuit Simulator with Precise Accuracy", 2002, IEEE, Proceedings of the 15th International Conference on VLSI Design.*

(Continued)

*Primary Examiner* — Omar Fernandez Rivas
*Assistant Examiner* — Angel Calle
(74) *Attorney, Agent, or Firm* — Alford Law Group, Inc.

(57) ABSTRACT

In one embodiment of the invention, a method of analyzing a circuit design is disclosed. In the method of analyzing a circuit design, a circuit is levelized into multiple levels. Circuit simulations of elements at a level are determined using circuit simulators, one for each element and in parallel in level order. Topological circuit loops may be removed from the circuit. Circuit simulation of the circuit may be performed on the circuit using the circuit simulations determined by the circuit simulators at each level of the circuit.

31 Claims, 9 Drawing Sheets

(56) References Cited

U.S. PATENT DOCUMENTS

| | | | | |
|---|---|---|---|---|
| 2006/0161413 | A1* | 7/2006 | Wei et al. | 703/14 |
| 2006/0200786 | A1* | 9/2006 | Chang | 716/6 |
| 2007/0089075 | A1* | 4/2007 | Ward | 716/4 |
| 2007/0219761 | A1* | 9/2007 | Kanapka et al. | 703/2 |

OTHER PUBLICATIONS

Fujio Yamamoto, and Sakae Takahashi, "Vectorized LU Decomposition Algorithms for Large-Scale Circuit Simulation", 1985, IEEE Transaction on computer aided desgn, vol CAD-4, No. 3.*

Luben Boianov and Innes Jelly, "Distributed Logic Circuit Simulation on a Network of Workstations", 1995, IEEE.*

Srinivas Patil, "Efficient circuit partitioning algorithms for parallel logic simulation", ACM 1989, 089791-341-8/89/0011/0361.*

Thomas R. Shiple, "Constructive Analysis of Cyclic Circuits", Proceedings of the 1996 European Design and Test Conference (ED &TC), IEEE 1996.*

Greg Snider, "Attacking the Semantic Gap Between Application Programming Languages and Configurable hardware", ACM FPGA 2001, Feb. 11-13, 2001.*

Dirk Behrens, "Circuit Partitioning using High Level Design Information", 1996.*

Robert Kramer, "The combining DAG: A Technique for parallel data flow analysis", 1994, IEEE.*

Luben Boianov, "Distributed Logic Circuit Simulation on a Network of Workstations", IEEE 1995.*

Peter M. Lee, "A parallel and Accelerated Circuit Simulator with precise accuracy", IEEE 2002.*

Robert B. Hitchcock, "Timing Verification and the Timing Analysis Program", 1982.*

John A. Chandy, "A parallel Circuit-Partitioned Algorithm for Timing Driven Cell Placement", IEEE 1997.*

Amir Ali Yazdanshenas, "CAD tools and algorithms of Processor-based Logic Emulators", Oct. 2005.*

Hariprasad Nannapaneni Rao, "A parallel algorithm for switch level timing simulation on a hypercube multiprocessor", 1989.*

Dreschler et al. "Level Assignment for Displaying Combinational Logic." [online] 2001. IEEE Database; 4 pages.

Shiple et al. "Constructive Analysis of Cyclic Circuits" [online] 1996. IEEE Databasel; 12 pages.

Chiueh, Tzi-cker. "Heresy: A hybrid Approach to Automatic Schematic Generation" [online] 1991. IEEE Database. 5 pages.

Snider et al. "Attacking the Semantic Gap Between Application Programming Languages and Configurable Hardware" 2001. ACM Database; 10 pages.

Maurer, Peter M. "Two New Techniques for Unit Delayed Compiled Simulation" 1992. IEEE Database. 11 pages.

Patil et al. "Efficient Circuit Partitioning Algorithms for Parallel Logic Simulation" 1989. ACM Database. 10 pages.

Chowdhury et al. "Analysis of Coupling Noise in Dynamic Circuit" 2003. IEEE Database. 6 pages.

Suyama et al. "LUT-based FPGA Technology Mapping using Permissible Functions" 2002. IEEE Database; 4 pages.

Huang et al. "Accurate and Efficeint Static Timing Analysis with Crosstalk" 2002. IEEE Database; 8 pages.

Geer, David. "Chip Makers Turn to Multicore Processors" May 2005. IEEE Database; 3 pages.

Office Action from U.S. Appl. No. 11/760,694; Anthony Lewis; Oct. 14, 2009; 32 pages.

Office Action from U.S. Appl. No. 11/760,694; Patel, Shambhavi K.; Jul. 6, 2010; 19 pages.

* cited by examiner (BACKGROUND)

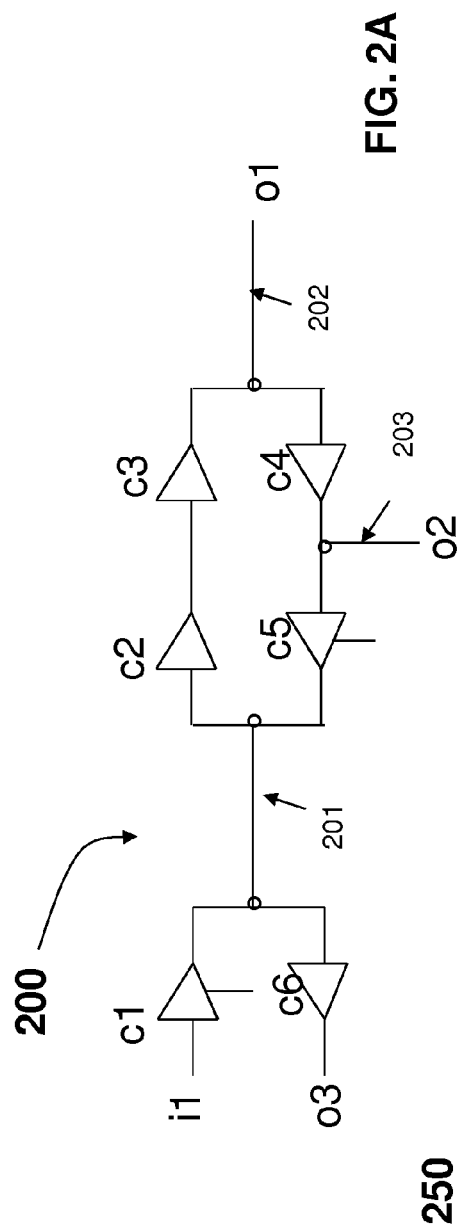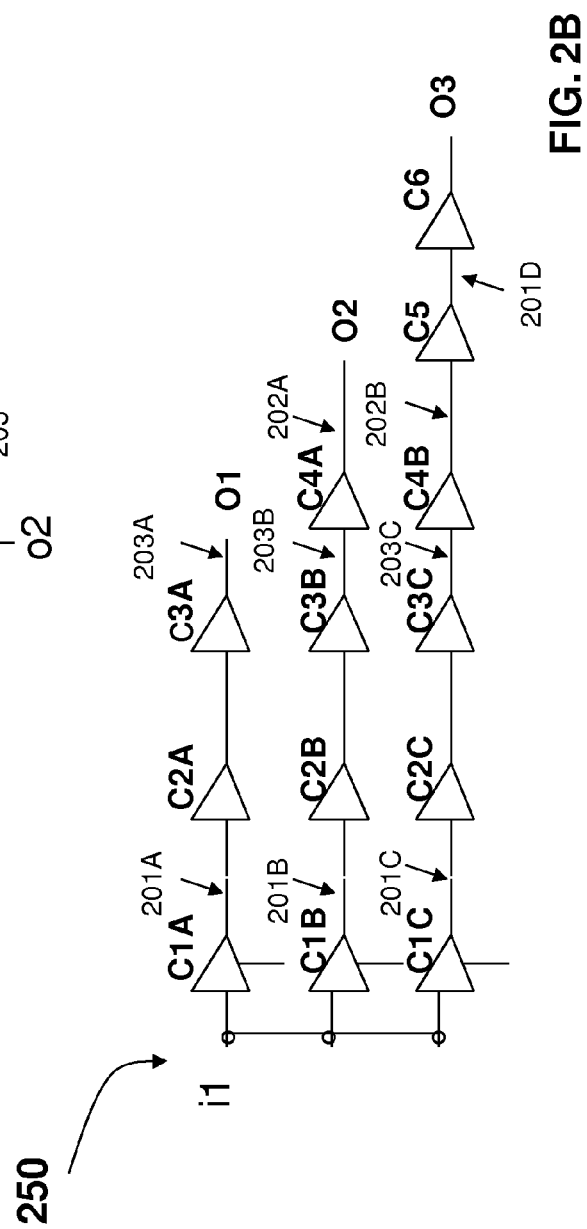

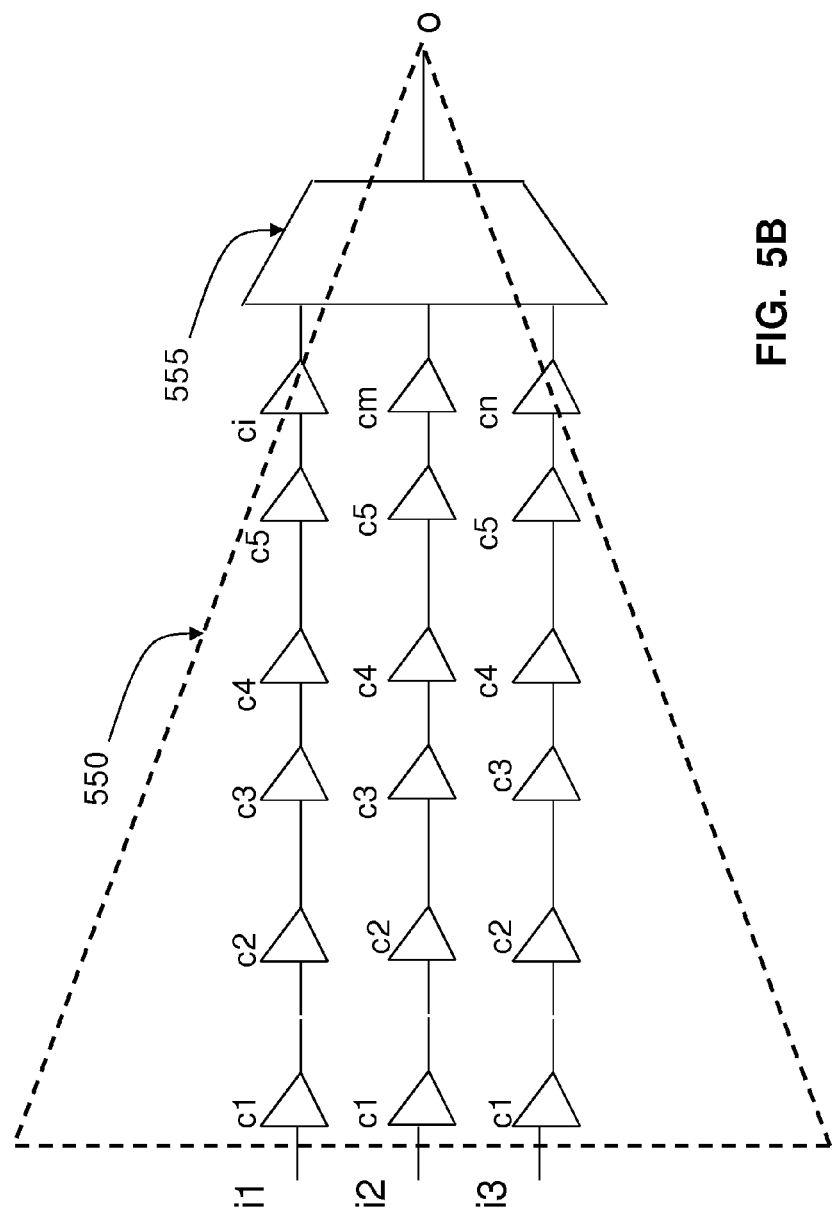

METHOD AND APPARATUS FOR CIRCUIT SIMULATION USING PARALLEL COMPUTING

CROSS REFERENCE TO RELATED APPLICATIONS

This non-provisional United States (U.S.) patent application claims the benefit and is a continuation-in-part (CIP) of U.S. patent application Ser. No. 11/760,694 filed on Jun. 8, 2007 by inventor Anthanasius William Spyrou, entitled METHOD AND APPARATUS FOR COMPUTING THE DELAYS OF DIGITAL CIRCUITS USING CIRCUIT SIMULATION AND USING HIGHLY PARALLEL COMPUTING, this non-provisional U.S. patent application further claims the benefit of provisional U.S. Patent Application No. 60/831,795 filed on Jul. 19, 2006 by inventor Anthanasius William Spyrou, entitled METHOD AND APPARATUS FOR CIRCUIT SIMULATION USING HIGHLY PARALLEL COMPUTING and provisional U.S. Patent Application No. 60/831,717 filed on Jul. 18, 2006 by inventor Anthanasius William Spyrou, entitled METHOD AND APPARATUS FOR COMPUTING THE DELAYS OF DIGITAL CIRCUITS USING CIRCUIT SIMULATION AND USING HIGHLY PARALLEL COMPUTING, both of which are incorporated herein by reference.

FIELD OF THE INVENTION

Embodiments of the invention relate generally to circuit design, and more specifically to circuit simulation of digital circuits.

BACKGROUND

FIG. 1 is a block diagram illustrating an example of a circuit simulation workflow. Generally, a circuit designer may use a hardware description language (HDL) (e.g., Verilog) to describe or code a circuit through equations and behavior descriptions. The HDL is then synthesized into a netlist 110 from a library. The netlist's library elements have detailed descriptions in the form of transistor level subcircuits. The netlist 110, together with the library subcircuits, input waveforms 115 and the boundary conditions 120, may be simulated and verified using a circuit simulation program (e.g., SPICE (simulation program with integrated circuit emphasis)), as shown in block 105. The output 125 of the circuit simulation program 105 may be used to generate a statically pre-characterized model. Current circuit simulation technologies are not adapted to handle large circuits efficiently.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A illustrates an example of a circuit with one or more loops.

FIG. 2B illustrates an example of an equivalent circuit that does not have any loop.

FIG. 5B is a block diagram illustrating an exemplary critical region in a circuit, in accordance with some embodiments.

DETAILED DESCRIPTION

Figure 1:
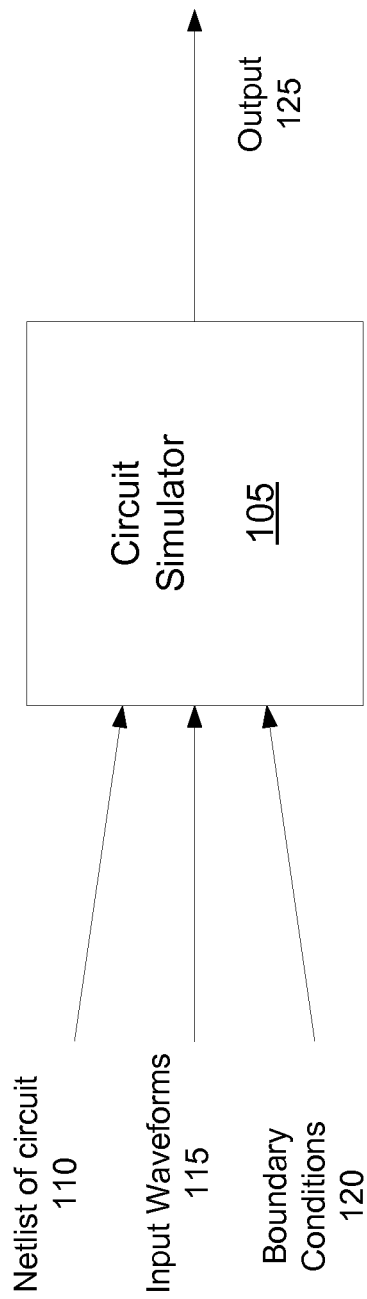
FIG. 1 is a block diagram illustrating an example of a circuit simulation workflow.

For some embodiments, methods and systems for performing circuit simulations are disclosed. Loops in the circuit may be removed. The circuit may then be levelized into multiple levels. Circuit simulation of the circuit may then be performed in parallel. Parallel circuit simulation may be performed using multiple computer systems. Parallel circuit simulation may also be performed using a computer system configured with one or more multi-cores processors.

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Loop Removal

FIG. 2A illustrates an exemplary circuit 200 including gates c1-c6, input 11, and outputs o1-o3 coupled together as shown. The inputs and outputs may lead to other parts of the circuit 200. A circuit may have one or more topological circuit loops. A topological circuit loop typically occurs when a circuit graph is formed by a static timing analyzer (STA). Since STA does not understand the functionality of the circuit or the intended usage of the circuit, loops can be formed. Loops can also be formed due to parasitic coupling capacitance between logical nets in the design. Embodiments of this invention use a graph identical to the graph used in STA to levelize the circuit although it does not make use of STA algorithms beyond levelization.

A topological circuit loop is a circuit which loops back onto the same node such as node 201, if all logic gates were to be turned on at the same time. Node 201 is a strongly connected component (SCC) as it shares input pins and output pins of some logic gates in the circuit 200. Node 201 may be a bidirectional pin such as a bit of a shared data bus with tristate drivers c1, c5 and input receivers c2, c6 output pins and input pins respectively coupled to the node 201. For example, a path from input i1 to output o3 through the gates c1-c6 is a topological circuit loop. As another example, a path from input i1 to output o2 through gates c1-c4 is another topological circuit loop.

If a circuit is to be broken into sub-circuits for parallel simulation, it is desirable to unroll or transform the topological circuit loops so that the sub-circuits are loop free. Thus, it is desirable to find or detect and remove or unroll the topological circuit loops in the circuit 200. Strongly connected components (SCC) may be found using well-known methods and loops will form SCC's in the graph. For each SCC, a depth first search (DFS) may be used to enumerate all paths inside the SCC from every input (e.g., i1) to every output (e.g., o1, o2, or o3) in the process of generating an equivalent circuit. A circuit is unrolled from each input to each output. One or more split pins and replicated gates may be used to break up the SCCs in the circuit 200 to further generate the equivalent circuit 250. For example, pin 201 of circuit 200 may be split into four split pins 201A-201D as shown in circuit 250. Similarly pins 202 and 203 of circuit 200 may be split into two split pins 202A-220B and three split pins 203A-203C, respectively.

FIG. 2B illustrates an exemplary loop-free equivalent circuit 250 without any topologic circuit loop corresponding to the circuit 200. The loop-free equivalent circuit 250 in this example includes three loop free paths. The first path from input i1 to output o1 is through gates c1A, c2A, and c3A. The second path from input i1 to output o2 is through gates c1B, c2B, c3B, and c4A. The third path from input i1 to output o3 is through gates c1C, c2C, C3C, c4B, c5, and c6.

In the generation of the equivalent circuit, various gates were replicated into the loop free equivalent circuit. For example, gate c1 of circuit 200 was replicated into gates c1A-c1C of the loop free equivalent circuit 250, gate c2 was replicated into gates c2A-c2C, gate c3 was replicated into gates c3A-c3C, and gate c4 was replicated into gates c4A-c4B.

For timing analysis, the original circuit 200 is then replaced by the loop free equivalent circuit 250 with its loop-free paths from each input to each output. An entire integrated circuit (IC) design netlist of a circuit may be searched for topological loop circuits. Equivalent circuits can be generated to replace the topological loop circuits so that the entire (IC) design netlist is loop-free. With the design netlist being loop-free, it can be levelized by a graph levelization process so that sub-circuits at the same level may be coincidentally simulated using a parallel computing system.

Levelization

Levelization is a process that may include ordering a circuit into multiple levels from an input end to an output end. Each level may include multiple elements (e.g., gates and wires) with associated loading including coupling capacitance and inductance.

Figure 3:
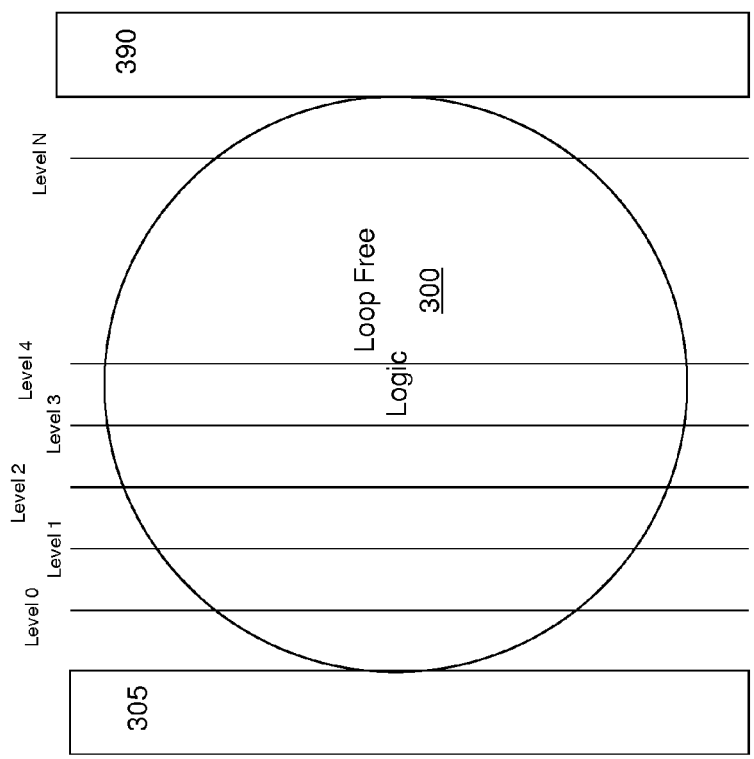
FIG. 3 illustrates one example of levelization of a circuit, in accordance with some embodiments.

FIG. 3 illustrates one example of levelization of a loop-free circuit, in accordance with some embodiments. Block 305 may be a register bank and or may simply represent timing start points, such as inputs, register clock pins, etc. Block 390 may be another register bank or may simply represent timing end points, such as outputs, register data pins, etc. The loop-free circuit 300 illustrated in between blocks 305 and 390 may not have any topological circuit loops.

The circuit 300 may include multiple levels illustrated as vertical lines each representing a level from level 0 to level n. Each line may be viewed as being associated with elements at the same level. The elements (also referred to as subcircuits herein) may be logic gates and wires with associated loading, including coupling capacitance, resistance and inductance, if any.

The arrival time windows and slew rates of all signals propagate from level to level during the operation of the levelized circuit. Thus, all timing points at a given level of the levelized circuit are independent from each other and sub-circuits or elements within the same level can be separated out and simulated in parallel together. For a typical integrated circuit design, there may be thousands of timing points at a given level that may be simulated in parallel together.

However, circuit simulations of elements at one level may not be processed until the circuit simulations of all elements at an immediately previous level has been completed. For example, the circuit simulations of level 1 may not begin until all circuit simulations of level 0 have been completed. The circuit simulations of level 2 may not begin until all circuit simulations of level 1 have been completed and so on.

In a levelized fashion from inputs to outputs, circuit simulations are performed on each gate and/or wire, in level order using the previous gates' and wires' output waveforms as input to the next level's gates' or wires' inputs as the circuit simulation for all circuit connection at the same level can be independently performed. Therefore, each gate and wire at the same level can be simulated in parallel over a levelized scheduling that spawns parallel circuit simulation runs from one level to the next.

Not only may circuit simulations be performed in parallel at each level in this manner, but sensitization and vector generation may be done in parallel at each level. Complex elements may be analyzed with exhaustive parallel simulation if needed.

To eliminate the need for multiple circuit simulations over timing window iterations, the levelized circuit may be further modified to include coupling information from neighboring circuits.

Graph Representation

Figure 4A:
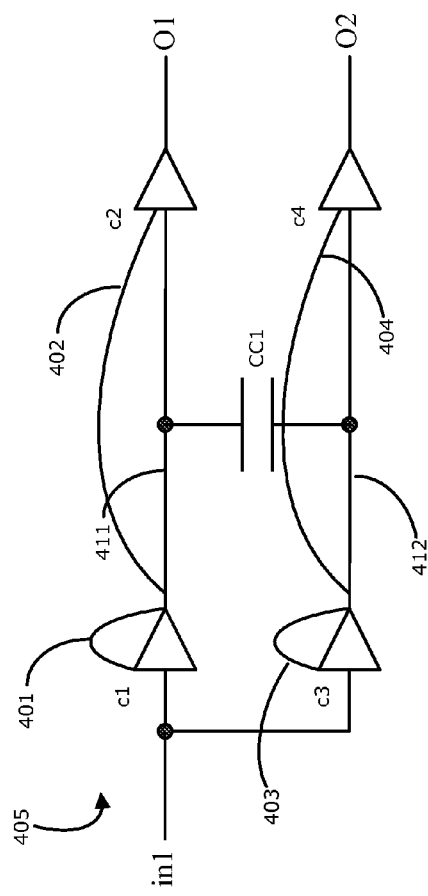
FIG. 4A illustrates an example of a graph representation of a circuit.

FIG. 4A illustrates an example of a graph representation of a circuit. Graph 405 may include input i1, and logic gates c1-c4 coupled together as shown to represent the circuit. To indicate the coupling effects in the circuit, the graph 405 may further include a coupling capacitor cc1 coupled between wires 411 and 412 and arcs 401-404.

The arc 401 from input to output across gate c1 may represent coupling effects associated with gate c1. The arc 402 from gate c1 to gate c2 may represent coupling effects associated with the wire 411 connecting gate c1 to gate c2. There may also be similar effects indicated by arcs 403-404 respectively associated with gate c3 and the wire 412 from gate c3 to gate c4.

The graph 405 may ignore some coupling effects. For example, during the simulation of the gate c3, the coupling effect of the capacitor cc1 may be ignored when the gate c3 is simulated for the first time. The coupling effect may be considered at a later time. When levelization is performed on the graph 405, it may result in the input i1 at a first level, the gates c1 and c3 at a second level, and the gates c2 and c4 at a third level.

Figure 4B:
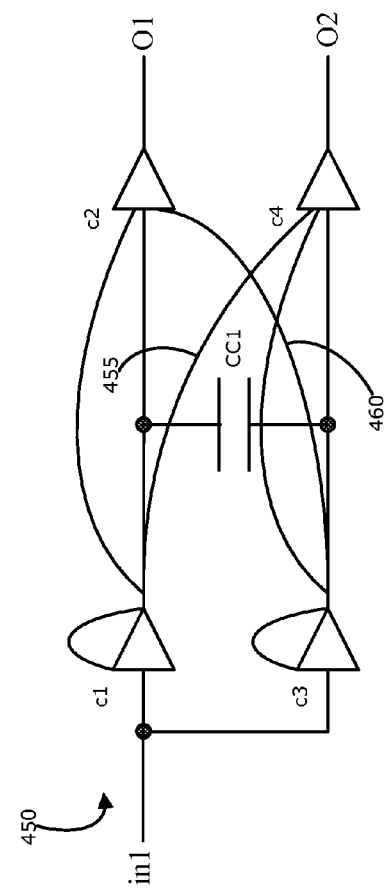
FIG. 4B illustrates another example of a graph representation of the same circuit as illustrated in FIG. 4A but takes into consideration of the coupling effects, in accordance with some embodiments.

Referring now to FIG. 4B, another exemplary graph representation is illustrated of the same circuit as illustrated in FIG. 4A but with consideration of additional coupling effects, in accordance with some embodiments. Graph 450 differs from the graph 405 in that it illustrates additional arcs 455 and 460 that are coupling causality arcs. Arc 455 represents a cross-coupling relationship from gate c1 to gate c4. Arc 460 represents a cross-coupling relationship from gate c3 to gate c2. The arcs 455 and 460 may represent transitions across the coupling capacitor cc1. The graph 450 allows graph levelization of a circuit so that the coupling capacitor cc1 may also be considered during circuit simulation. Thus, the graph 450 may allow for performing circuit simulation of multiple elements to be performed at the same time. The graph 450 may be referred to herein as a delay causality graph.

With either of the graphs 405 and 450, it may be necessary to know the waveform coupled into the input 11 in order to calculate the output of gates c1 and c3. Similarly, it may be necessary to know the output of the gate c1 in order to calculate the waveform at the input of the gate c2. One difference is the consideration of the coupling effects in the graph 450 such that the waveform to the input of the gate c2 in the graph 405 will be different from the waveform to the input of the gate c2 in the graph 450.

The graphs 405 and 450 may have one vertex per gate pin in the circuit and one arc per connection as is standard in static timing analysis. However, for certain bidirectional pins in the circuit, there may be two vertices, one for the driver side and one for the load side of a bidirectional pin.

Referring to the graph 450, simulation of the gate c3 will include the coupling effects of the capacitor cc1, the gate c2 and the gate c4. Similarly, simulation of the gate c1 will include the coupling effects of the capacitor cc1, the gate c2 and the gate c4. These coupling effects show up in the waveform to the input of the gates c2 and c4. Using the current technique, the waveform at the input of the gate c2 may already include the noise effects and the delay effects of the circuit. Thus, an input waveform with both noise and delay effects determined in advance may be used to drive the gate c2. The waveform generated at the output of the gate c2 may be propagated to a logic gate at the next level of the levelized circuit. Gate c4 may be similarly driven by a waveform with both noise and delay effects determined in advance.

With the graph 450, in order to calculate wave form input to the gate c2, it may be necessary to know both the waveforms at the output of the gate c1 and at the output of the gate c3. When levelization is performed on the graph 450, it may result in the input i1 at a first level, the gates c1 and c3 at a second level, and the gates c2 and c4 at a third level. In this manner, the waveforms that are coupled into gates c2 and c4 are computed prior to the analysis of gates c2 and c4 and the generation of output waveforms there-from. In contrast, if levelization was performed on the graph 405, it may result in the input i1 at a first level and gates c1 through c4 on a second level with their analysis all being computed at the same time. Previously, it was acceptable to use the graph 405 because noise and delay calculations were initially ignored and then revisited at a later time with a different simulation. By considering these effects into the graph 450, the current technique may enable the circuit simulations to be performed at the same time.

Referring to the levelization illustration of FIG. 3, it may possible to have all elements at a given level be simulated in parallel. For typical system on chip designs, there may be thousands of elements at a given level. Each element may be associated with a timing point. For example, referring to the vertical line associated with the level 1, all the elements in the circuit 300 that are at the level 1 may be processed in parallel.

Computer Systems

Figure 5A:
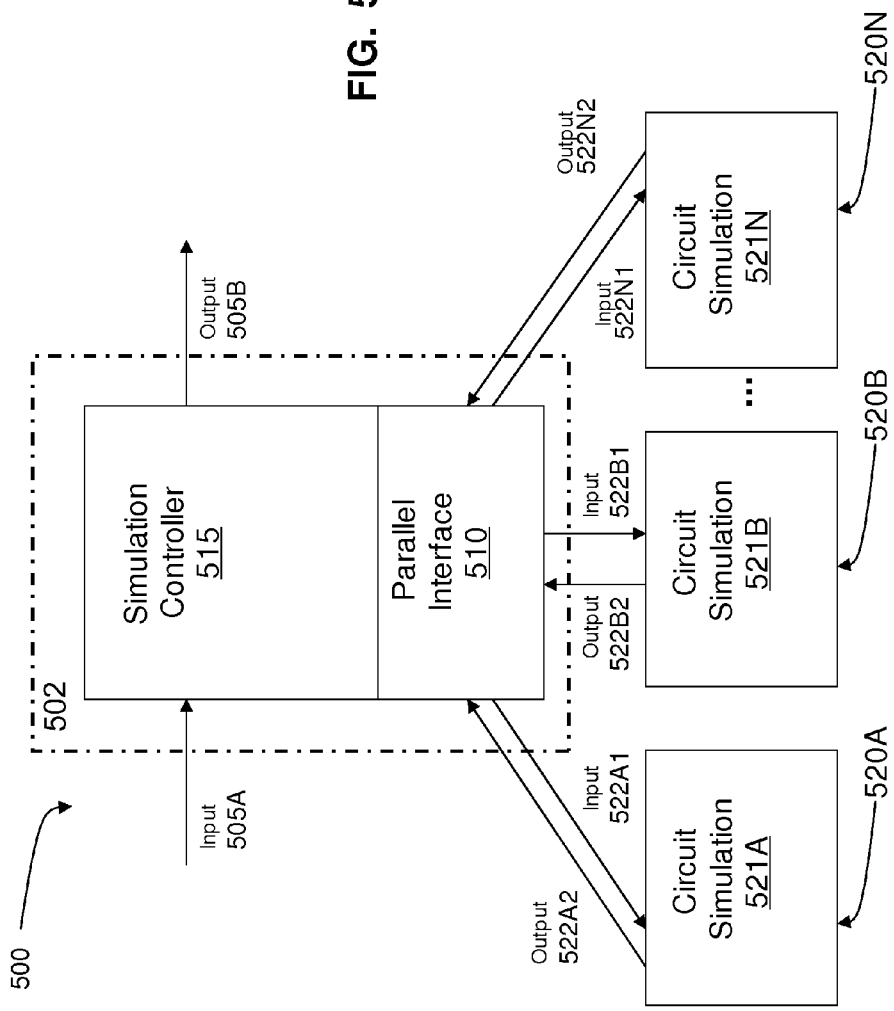
FIG. 5A is a block diagram illustrating an example of a computer network that may be used to perform circuit simulation, in accordance with some embodiments.

FIG. 5A is a block diagram illustrating an example of a computer network 500 that may be used to perform the circuit simulation of a circuit, in accordance with some embodiments of the invention. The computer network 500 may include computer system 502 and computer systems 520A-520N each of which may include one or more processors. The computer system 502 may include simulation controller 515, which receives input 505A and generates output 505B. The input 505A may include a netlist, boundary conditions and input waveform. The output 505B may be a waveform. The computer system 502 may further include a parallel interface or a multiple network interface 510.

For some embodiments, the simulation controller 515 may be coupled to the network interface 510 to enable the simulation controller 515 to communicate with the computer systems 520A-520N in parallel. Each of the computer systems 520A-520N may include a circuit simulation logic 521A-521N, respectively. The computer system 502 may be viewed as a master or primary computer system, while the computer systems 520A-520N may be viewed as slave or secondary computer systems.

The circuit simulation logic 521A may receive input 522A1 from the simulation controller 515 and may generate output 522A2 to the simulation controller 515. Similarly, the circuit simulation logic 521B may receive input 522B1 and may generate output 522B2, and the circuit simulation logic 521N may receive input 522N1 and may generate output 522N2.

Each of the circuit simulation logic 521A-521N may perform the circuit simulation for each of the individual elements in level order. Output waveforms from the elements at an immediately previous level (e.g., level 1) may be used as input to elements at a current level (e.g., level 2).

The techniques described herein may take advantage of the fact that all circuit connections at the same level may be independently calculated. Therefore, during the process of circuit simulation, each element at the same level may be simulated in parallel. Since normal circuits may have many thousands of circuit connections at the same level, for some embodiments, it may be possible to use many computer systems (e.g., computer systems 520A-520N) to perform the parallel operations. For some embodiments, the circuit simulator on each of the computer systems may need to be network-aware. The circuit simulator being network-aware may include being able to receive and send information over a network, being able to work with other components and resources that may exist in other computer systems in the network. For example, the circuit simulator 521A in the computer system 520A may need to be able to exchange information with the simulation controller 515 over a network. The circuit simulator in the computer system 520A may also recognize that there is another circuit simulator 521B in the computer system 520B that is also exchanging information with the simulation controller 515 over the same network.

The individual circuit simulations may be received from the computer systems 520A-520N. The simulation controller 515 may then add results of the individual circuit simulations to determine the circuit simulations at each level and eventually the circuit simulation of the circuit.

For some embodiments, the parallel operations described above may be performed using a single computer system configured with one or more multi-core processors. The multi-core processor may be capable of handling multi-threads. The multi-core processor may be capable of handling multiple processes. In a configuration where there are multiple multi-core processors, each of the multi-core processors may be capable of handling multiple processes.

Critical Region

The current techniques may be compute-intensive, and therefore it may be desirable to limit the circuit simulations or other analysis to a critical region. STA may be used to discover the critical regions of the circuit. The current techniques may then be applied only to those critical regions. Running the circuit simulation on the critical regions may be better than running the circuit simulation on a critical path. When simulating the critical path, it may be important that the critical path is truly the longest path. However, if there is any significant difference between the simulation and the delay calculation used to order a critical path, then the critical path may be invalid.

FIG. 5B is a diagram that illustrates an example of a critical region, in accordance with some embodiments. Critical region 550 may comprise an area of a circuit. It may include multiple one or more potential critical paths. For example, the critical region 550 may include three paths. The first path may include input i1, gates c1-ci, and output o. The second path may include input i2, gates c1-cm, and output o. The third path may include input i3, gates c1-cn, and output o. In the current example, the three paths are coupled to a multiplexer 555. One or more control signals (not shown) may be used to determine which of the three paths show up at the output o. The control signals may be controlled by the STA and the path that continues to the output o may be the critical path.

Performing circuit simulation on a critical region may be more effective since the circuit simulations for an entire critical region may be computed using the current techniques of parallel simulation. The current techniques may also be used to accommodate any number of available computer systems. For example, when there are five computer systems available, the technique may be scaled to five parallel circuit simulation operations.

Note that although gates are described, the techniques may be applicable for full custom digital circuits designed at the transistor level as well by grouping transistors into strongly connected components and levelizing those groups. For some embodiments of the invention, any time an element is simulated, the only overhead is to pass the new parasitic network to the simulator. It may not be necessary to pass a device netlist to the circuit simulator each time a simulation is run.

Process

Figure 6A:
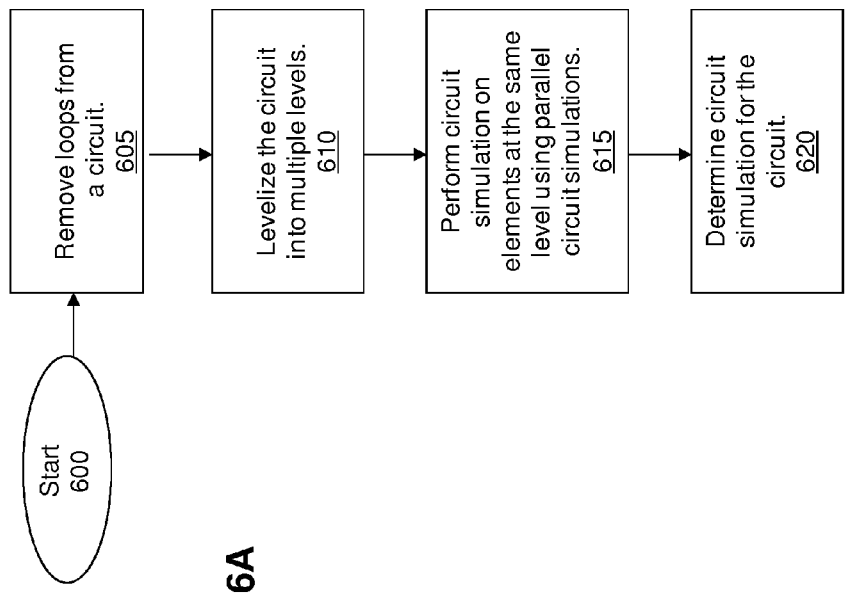
FIGS. 6A-6B are diagrams that illustrate an example of a process that may be used to perform circuit simulation of a circuit, in accordance with some embodiments.
Figure 6B:
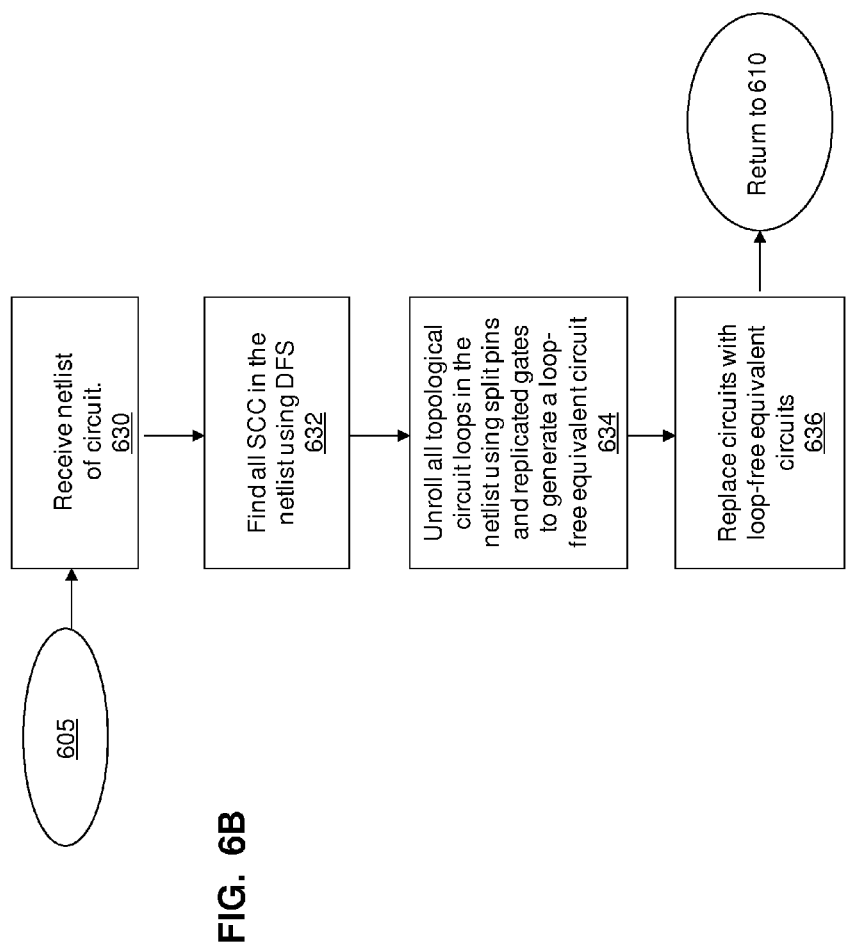

FIGS. 6A-6B are flow charts illustrating an exemplary process that may be used to perform circuit simulation of a circuit, in accordance with some embodiments. The process starts at block 600 and jumps to block 605.

At block 605, loops are removed from the circuit. Different techniques may be used to remove the loops. A result of the operations in block 605 may be a circuit that is equivalent to the original circuit but without any loop. FIG. 6B illustrates an exemplary process that may be taken to remove topological circuit loops from a circuit.

Referring now to FIG. 6B, the netlist of the circuit is received at block 630. A netlist representation of a digital circuit may be received along with its boundary conditions in order to perform the process upon it.

At block 632, all the strongly connected components are detected in the netlist using a depth first search (DFS) in order to detect possible topological circuit loops in the circuit.

Then at block 634, the topological circuit loops are unrolled in the netlist by using split pins and replicated gates to generate loop-free equivalent circuits.

Next at block 636, the topological circuit loops are eliminated from the circuit design by replacing circuits therein with the loop-free equivalent circuits. The process then returns to block 610 of FIG. 6A.

Referring now back to FIG. 6A and block 610, the circuit may be levelized into two or more levels. Each level may include elements that may include, for example, gates and wires.

Then at block 615, circuit simulations may be performed for each of the elements at the same level. The circuit simulations may be performed in parallel at each level and in level order from input to outputs. Each circuit simulation may be performed using a circuit simulator, such as a transistor level circuit simulator (e.g., SPICE or SPECTRE by Cadence Design Systems, Inc.). Each circuit simulator may run on a different computer system connected to a network.

Next at block 620, a simulation controller may be used to determine the circuit simulations for the circuit. The simulation controller may use the results of the parallel circuit simulations performed in block 615.

Computer System

Figure 7:
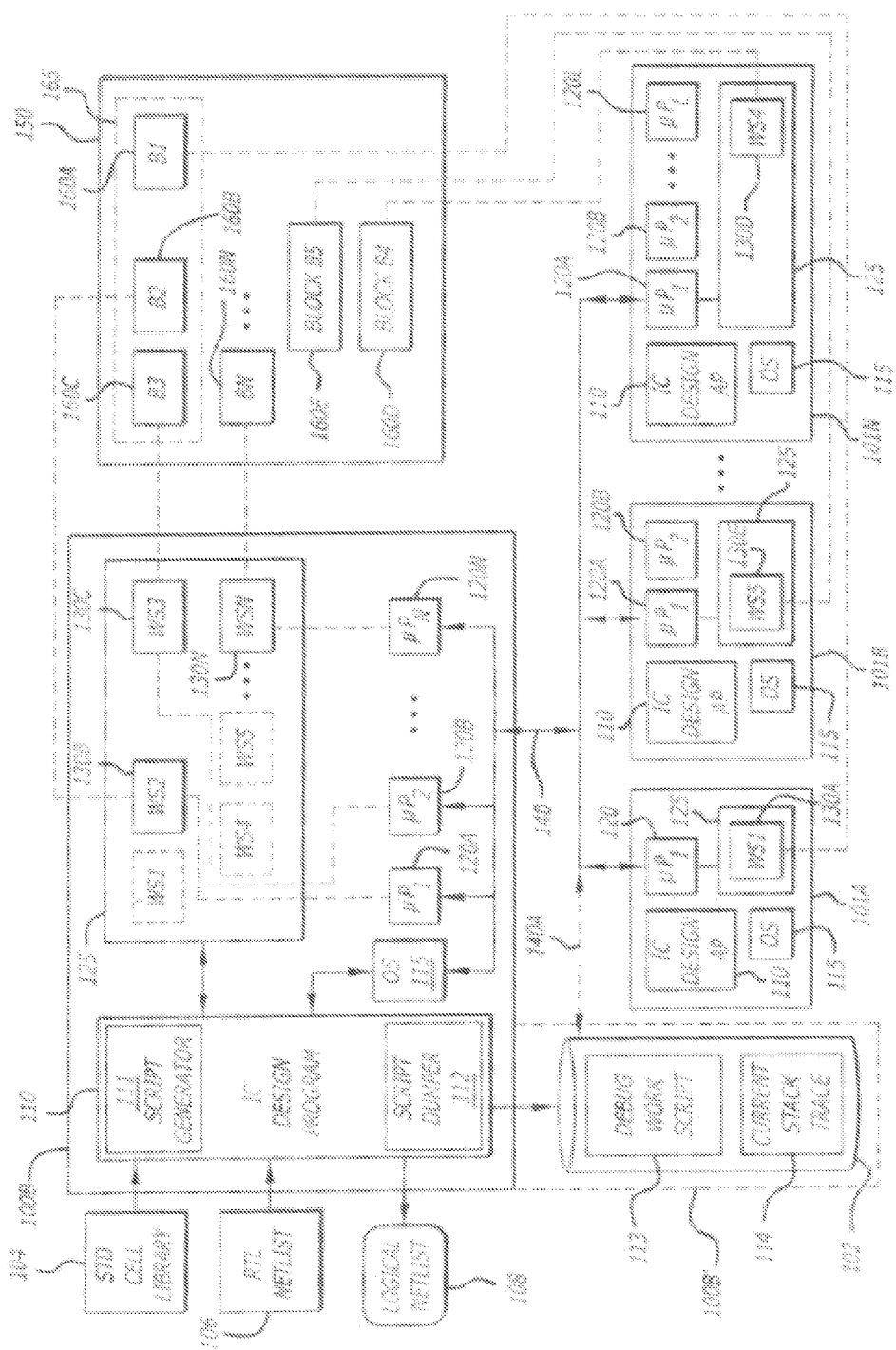
FIG. 7 is a block diagram illustrating an integrated circuit design program in a computer system that forms work scripts that are shared over a network with other computer systems to generate blocks of the integrated circuit design, in accordance with some embodiments.

Referring now to FIG. 7, a block diagram of a network of computer systems to simulate an integrated circuit design is illustrated. Work scripts may be formed in one computer system to simulate a portion of the integrated circuit design with an integrated circuit design program and may be shared over a network with other computer systems to simulate blocks, elements or sub-circuits of an integrated circuit design 150, in parallel in accordance with some embodiments of the invention. In FIG. 7, block diagrams of computer systems 1008, 101A-101N are illustrated coupled together through a network 140. The computer systems 1008, 101A-101N may optionally be referred to as servers. A block diagram of the integrated circuit design 150 is also illustrated in FIG. 7 for correlation to processes being performed by the computer systems 1008, 101A-101N. The network 140 coupling the computer systems 1008, 101A-101N together may be a local area network (LAN), a wide area network (WAN), or a combination thereof. Each of the computer systems 1008, 101A-101N may include a copy of the integrated circuit design program 110 to execute if authorized by a license key mechanism. The integrated circuit design program 110 may support multiple threads of execution on a multi-processor computer system. Alternatively, the integrated circuit design program 110 may support multiple processes of execution across multiple computer systems with one or more processors.

Computer system 1008 may act as a primary or master computer including a master process to generate work scripts that are shared over the network 140 to secondary or slave computer systems 101A-101N. One or more work scripts WS1 130A, WS 4 130D, WS5 130E may be sent out over the network 140 to the slave computer systems 101A-101N, for example. Other work scripts, WS2 130B, WS3 130C, and WSN 130N for example, may be executed by multiple processors 120A-120N in the master computer system 1008. With each of the computer systems 1008, 101A-101N having a copy of the integrated circuit design program 110, they may respectively simulate the blocks, elements, or sub-circuits of the integrated circuit design 150 in response to the work scripts.

For some embodiments, each of the computer systems 1008, 101A-101N may have a copy of a transistor circuit simulation program (not shown), and they may respectively perform circuit simulation on an element at the same level once the integrated circuit design 150 has been levelized as illustrated with the example in FIG. 3. The computer system 100B may further perform elements of the process described in FIGS. 6A-6B, including making the integrated circuit design to be loop-free and levelizing the integrated circuit design 150 so that blocks, sub-circuits, and elements of the integrated circuit design at the same level may be independently simulated in parallel together.

Additionally, each of the computer systems 1008, 101A-101N may have access to the standard cell library 104 to perform work on blocks, subcircuits or elements of the integrated circuit design 150 in response to the work scripts. A shared file system, such as made available on the non-volatile storage 102, may be provided so that computer systems 1008, 101A-101N may access one or more libraries including the standard cell library. The master process generates an initialization script that may be sent to each and every slave process after being launched. The initialization script includes general IC design program settings and library settings including the location of the shared file system where every slave process can access a library or database to perform work or simulate the IC design 150.

Each of the computer systems 1008, 101A-101N may further include an operating system (OS) 115, one or more processors 120, and a volatile storage 125, such as memory and/or virtual memory. The computer system 1008 may internally include a non-volatile storage 102, such as a hard drive, to form the computer system 100B'. Otherwise, the non-volatile storage 102 may be external and coupled to the computer system 100B or alternatively coupled to the network 140 as a networked attached storage device. The information stored in the non-volatile storage 102 is ordinarily not lost when the power is removed.

As discussed previously, the computer systems 1008, 101A-101N respectively perform work on blocks of the integrated circuit design 150 over the network 140 using a copy of the integrated circuit design program 110 in response to the work scripts 130A-103N. Allowing work on blocks of the integrated circuit design 150 to be divided up and spread across a network to the computer systems 1008, 101A-101N may be referred to as super-threading. In this case, the processes to perform work on the integrated circuit design 150 are spread across the network 140 from the master computer system 100B executing a master process to the slave computer systems 101A-101N executing slave processes. The master process in the computer system 100B may send work scripts out over the network 140 to the slave computer systems 101A-101N. For example, computer system 101A may execute the work script WS1 130A to work on block B1 160A of the integrated circuit design 150. Computer system 101B may execute the work script WS5 130E to work on block B5 160E of the integrated circuit design 150, and so on and so forth, to the Nth computer system 101N that may execute the work script WS4 130D to work on block B4 160D of the integrated circuit design 150.

For some embodiments, the computer systems 100B, 101A-101N may be used in a super-threading environment. Super-threading takes advantage of the larger memory capacity that is available today given the lower memory prices per megabyte. With super-threading, a copy of the IC design program 110 in a computer system is duplicated and loaded into memory for each processor within each computer system 100B, 101A-101N so that they can be independently executed with the work script without sharing memory. For example, the computer system 101B has two processors 120A-120B. Two copies of the IC design program 110 can be read into memory 125 of the computer system 101B to independently execute two work scripts using the two processors 120A-120B and perform work on two blocks of the integrated circuit design 150. The memory 125 may be split into two independent memory portions for the respective processors 120A-120B. That is, super-threading does not share memory space between processors so that the work can be independent and split up to be sent across a network to different computer systems. With the IC design work being split up into multiple processes to be performed by different computer systems or servers over the network, more work can be done in parallel by additional processors. Thus, the overall time for the IC design program 110 to perform work on the entire IC design 150 can be reduced by using super-threading.

Embodiments of a system for performing circuit simulations of a circuit using parallel circuit simulations are described herein. In the above description, numerous specific details are set forth to provide a thorough understanding of embodiments of the invention. One skilled in the relevant art will recognize, however, that embodiments of the invention can be practiced without one or more of the specific details, or with other methods, components, materials, etc. For example, embodiments of the prevention may enable litho-aware and/or chemical-mechanical-planarization (CMP) aware delay calculation. Embodiments of the invention may also enable post-silicon aware circuit simulations when it is possible to extract the real geometries from a circuit manufactured in silicon, instead of simulating or modeling the delay calculation before silicon. In other instances, well-known structures, materials, or operations are not shown or described in detail to avoid obscuring the description.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

The above description of illustrated embodiments of the invention, including what is described in the abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A method of performing circuit timing simulation of a circuit design, the method comprising:
    removing one or more topological circuit loops from a netlist of the circuit design to form a loop-free circuit design;
    levelizing the netlist of the loop-free circuit design into a plurality of levels from input to output, each of the plurality of levels having one or more subcircuit elements between one or more timing start points and one or more timing end points; and performing a plurality of circuit timing simulations in parallel for subcircuit elements in level order in response to the levelizing of the netlist of the loop-free circuit design, wherein the plurality of circuit timing simulations are performed in parallel for subcircuit elements at a level prior to performing the plurality of circuit timing simulations in parallel for subcircuit elements at a next level.

2. The method of claim 1, wherein
the levelizing of the circuit design includes
using coupling causality arcs in the loop-free circuit design that are levelized and represent relationships of timing causality of coupling capacitors in the loop-free circuit design.

3. The method of claim 1, wherein
the plurality of circuit timing simulations are performed in parallel using multiple circuit timing simulators, each circuit timing simulator performing circuit timing simulation for each of the subcircuit elements at each level.

4. The method of claim 3, wherein
each of the circuit timing simulators is network aware and is configured to run on a different computer system.

5. The method of claim 3, wherein
each of the circuit timing simulators are configured to run on a computer system equipped with a multi-core processor.

6. The method of claim 5, wherein
the multi-core processor is capable of handling multiple threads.

7. The method of claim 6, wherein
the multi-core processor is capable of handling multiple processes.

8. The method of claim 3, wherein
each of the circuit timing simulators are configured to run on a computer system equipped with two or more multi-core processors, each of the multi-core processors capable of handling multiple processes.

9. The method of claim 8, wherein
each of the circuit timing simulators is configured to run as a process.

10. The method of claim 1, further comprising:
performing circuit timing simulation of the circuit design using the plurality of circuit timing simulations performed for the subcircuit elements in the level order.

11. The method of claim 3, wherein
the circuit design includes a critical region, and
each of the circuit timing simulators is used to perform the plurality of circuit timing simulations associated with the critical region in the circuit design.

12. The method of claim 11, wherein
one or more of the subcircuit elements comprises a gate including coupling capacitance.

13. The method of claim 11, wherein
one or more of the subcircuit elements comprises a wire including coupling capacitance.

14. The method of claim 1, wherein
the removing one or more topological circuit loops from the circuit design includes
searching for strongly connected components in the netlist with a depth first search to detect topological circuit loops, and
unrolling all topological circuit loops in the netlist to generate loop-free equivalent circuits in the loop-free circuit design.

15. The method of claim 14, wherein
the unrolling uses split pins and replicated gates to generate the loop-free equivalent circuits in the loop-free circuit design.

16. The method of claim 1, wherein
one or more of the subcircuit elements comprises a transistor.

17. The method of claim 1, wherein
the one or more timing start points are a first register bank, and
the one or more timing end points are a second register bank.

18. A non-transitory computer readable storage medium having stored therein sequences of instructions which are executable by a system, and which, when executed by the system, cause the system to perform a method comprising:
converting a netlist of an initial circuit design having topological circuit loops into a circuit design without topological circuit loops;
levelizing the netlist of the circuit design from input to output into multiple levels of subcircuit elements between one or more timing start points and one or more timing end points;
performing a first plurality of circuit timing simulations in parallel for subcircuit elements at a first level of the circuit design between at least a first timing start point and at least a first timing end point; and
after completion of the performing of the first plurality of circuit timing simulations in parallel of all the subcircuit elements at the first level of the circuit design, performing a second plurality of circuit timing simulations in parallel for subcircuit elements at a second level of the circuit design between at least a second timing start point and at least a second timing end point.

19. The non-transitory computer readable storage medium of claim 18, wherein
the first and second plurality of circuit timing simulations are performed using multiple circuit timing simulators, each circuit timing simulator performing one of the plurality of circuit timing simulations for each of the one or more subcircuit elements of a level in a level order.

20. The non-transitory computer readable storage medium of claim 19, wherein
each of the multiple circuit timing simulators is configured to run on a different computer system connected in a network.

21. The non-transitory computer readable storage medium of claim 19, wherein
each of the multiple circuit timing simulators is configured to run on a computer system equipped with one or more multi-core processors, wherein each of the multi-core processors is capable of handling multiple threads or multiple processes.

22. The non-transitory computer readable storage medium of claim 18, further comprising:
performing circuit timing simulation of the overall circuit design using results of the plurality of circuit timing simulations determined by the multiple circuit timing simulators.

23. The non-transitory computer readable storage medium of claim 22, wherein
the circuit timing simulation of the overall circuit design is performed within a corresponding critical region of the circuit.

24. The non-transitory computer readable storage medium of claim 23, wherein
- a critical path is determined from the circuit timing simulation performed within the corresponding critical region.

25. The non-transitory computer readable storage medium of claim 18, wherein
- the one or more timing start points are a first register bank, and
- the one or more timing end points are a second register bank.

26. A computer network to perform circuit timing simulation of a circuit design, the computer network comprising:
- a primary computer system to perform circuit timing simulation over all of the circuit design, the primary computer system to remove topological circuit loops from a netlist of the circuit design to form a loop-free circuit design and subsequently levelize the netlist of the loop-free circuit design into a plurality of levels of subcircuit elements between one or more timing start points and one or more timing end points; and
- a plurality of secondary computer systems each coupled to the primary computer system for parallel communication, wherein after the netlist of the loop-free circuit design is levelized each of the plurality of secondary computer systems performs parallel circuit timing simulation of the subcircuit elements of each level in the netlist of the loop-free circuit design in level order prior to performing parallel circuit timing simulation of the subcircuit elements in each next level of the netlist.

27. The computer network of claim 26, wherein
- the primary computer system includes a communication interface to couple in parallel to the plurality of secondary computer systems.

28. The computer network of claim 26, wherein
- in level order, the plurality of secondary computer systems perform circuit timing simulations in parallel of the subcircuit elements in the loop-free circuit design between one or more timing start points and one or more timing end points in a first level before performing circuit timing simulations in parallel of the subcircuit elements in the loop-free circuit design between one or more timing start points and one or more timing end points in a second level.

29. The computer network of claim 28, wherein
- the primary computer system performs the circuit timing simulation over all the circuit design by using the circuit timing simulations for each level.

30. The computer network of claim 26, wherein
- each of the plurality of the secondary computer systems is configured with a multi-core processor capable of handling multiple threads or multiple processes, and
- wherein each of the multiple threads or multiple processes is associated with a circuit timing simulator.

31. The computer network of claim 26, further comprising:
- a network coupled between the primary computer system and the plurality of secondary computer systems, the network to couple the plurality of secondary computer systems to the primary computer system.

\* \* \* \* \*